United States Patent
Hayashi et al.

(10) Patent No.: US 7,638,829 B2
(45) Date of Patent: Dec. 29, 2009

(54) CAPACITOR OF DYNAMIC RANDOM ACCESS MEMORY AND METHOD OF MANUFACTURING THE CAPACITOR

(75) Inventors: Yumi Hayashi, Ayase (JP); Hayato Nasu, Soka (JP); Kazumichi Tsumura, Kawasaki (JP); Takamasa Usui, Tokyo (JP); Hiroyoshi Tanimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 372 days.

(21) Appl. No.: 11/432,660

(22) Filed: May 12, 2006

(65) Prior Publication Data

US 2007/0170483 A1    Jul. 26, 2007

(30) Foreign Application Priority Data

Sep. 9, 2005   (JP) .............................. 2005-262502

(51) Int. Cl.
*H01L 27/108*    (2006.01)

(52) U.S. Cl. .............................. 257/304; 257/E27.092; 257/E27.093

(58) Field of Classification Search ................. 257/311, 257/304, E27.092, E27.093
See application file for complete search history.

(56) References Cited

U.S. PATENT DOCUMENTS

| | | | |
|---|---|---|---|
| 5,266,511 A | 11/1993 | Takao | |
| 5,571,742 A | 11/1996 | Jeong | |
| 6,066,892 A | 5/2000 | Ding et al. | |
| 6,130,450 A | 10/2000 | Kohyama et al. | |
| 6,348,402 B1 | 2/2002 | Kawanoue et al. | |
| 6,664,185 B1 | 12/2003 | Wang et al. | |
| 6,706,629 B1 | 3/2004 | Lin et al. | |
| 6,922,351 B2 | 7/2005 | Natori et al. | |
| 7,012,002 B2 | 3/2006 | Kim et al. | |
| 7,078,336 B2 | 7/2006 | Cheng et al. | |
| 7,304,384 B2 | 12/2007 | Koike et al. | |
| 2002/0043700 A1 | 4/2002 | Sasaki et al. | |
| 2002/0064970 A1* | 5/2002 | Chooi et al. | ................ 438/785 |
| 2002/0094615 A1* | 7/2002 | Kunikiyo | .................... 438/155 |
| 2003/0227089 A1 | 12/2003 | Watanabe et al. | |

(Continued)

FOREIGN PATENT DOCUMENTS

JP    2-062035 A    3/1990

(Continued)

OTHER PUBLICATIONS

U.S. Appl. No. 11/440,453, filed May 25, 2006, Usui et al.

(Continued)

*Primary Examiner*—Steven Loke
*Assistant Examiner*—Earl N Taylor
(74) *Attorney, Agent, or Firm*—Foley & Lardner LLP

(57) ABSTRACT

A transistor formed on a semiconductor substrate has a gate electrode formed via a gate insulating film and first and second diffusion layers formed in the semiconductor substrate, the first and second diffusion layers being positioned at both sides of the gate electrode. A first electrode is connected to the first diffusion layer of the transistor. A capacitor insulating film formed on the first electrode is formed of a silicon oxide film containing a substrate which is faster than Cu in diffusion velocity and which more readily reacts with oxygen than Cu does. A second electrode formed on the capacitor insulating film is formed of one of a Cu layer and another Cu layer containing the substance.

4 Claims, 7 Drawing Sheets

U.S. PATENT DOCUMENTS

| | | | |
|---|---|---|---|
| 2004/0106254 A1* | 6/2004 | Furuhata et al. | 438/243 |
| 2004/0150073 A1 | 8/2004 | Matumoto et al. | |
| 2004/0183142 A1* | 9/2004 | Matsuo et al. | 257/406 |
| 2004/0245606 A1* | 12/2004 | Chiang et al. | 257/635 |
| 2006/0017115 A1* | 1/2006 | Tu et al. | 257/371 |
| 2007/0002239 A1* | 1/2007 | Koike | 349/139 |
| 2007/0004049 A1 | 1/2007 | Nasu et al. | |
| 2007/0057302 A1* | 3/2007 | Ho et al. | 257/301 |

FOREIGN PATENT DOCUMENTS

| | | |
|---|---|---|
| JP | 5-047760 A | 2/1993 |
| JP | 6-326267 A | 11/1994 |
| JP | 8-115914 A | 5/1996 |
| JP | 8-139092 A | 5/1996 |
| JP | 9-97880 A | 4/1997 |
| JP | 11-054458 A | 2/1999 |
| JP | 11-087349 A | 3/1999 |
| JP | 2001-044156 A | 2/2001 |
| JP | 2003-332261 A | 11/2003 |
| JP | 2004-172169 A | 6/2004 |
| JP | 2004-235616 A | 8/2004 |
| JP | 2005-277390 A | 10/2005 |
| KR | 10-0203536 B1 | 6/1999 |
| KR | 2002-0026568 | 4/2002 |
| WO | WO 01/13415 A1 | 2/2001 |
| WO | WO 03/023858 A1 | 3/2003 |

OTHER PUBLICATIONS

T. Usui et al., "Low Resistive and Highly Reliable Cu Dual-Damascene Interconnect Technology Using Self-Formed MnSi $O_y$ Barrier Layer," Proceeding of IEEE IITC, Jun. 2005, 3 pages.

J. Koike et al., "Self-forming diffusion barrier layer in Cu-Mn alloy metallization", Applied Physics Letters 87, Jul. 22, 2005, pp. 041911-1-041911-3.

T. Usui et al., "Low Resistive and Highly Reliable Cu Dual-Damascene Interconnect Technology Using Self-Formed $MnSi_xO_y$ barrier Layer", Proceeding of IEEE IITC, Jun. 2005, 3 pages.

T. Usui, U.S. PTO Office Action, U.S. Appl. No. 11/440,453, dated Dec. 10, 2008, 8 pages.

T. Usui, U.S. PTO Office Action, U.S. Appl. No. 11/440,453, dated May 9, 2008, 13 pages.

J. Koike, U.S. PTO Office Action, U.S. Appl. No. 11/063,876, dated Mar. 1, 2007, 13 pages.

W. A. Lanford et al., Low-temperature passivation of copper by doping with Al or Mg, Thin Solid Films, vol. 262, 1995, pp. 234-241.

* cited by examiner

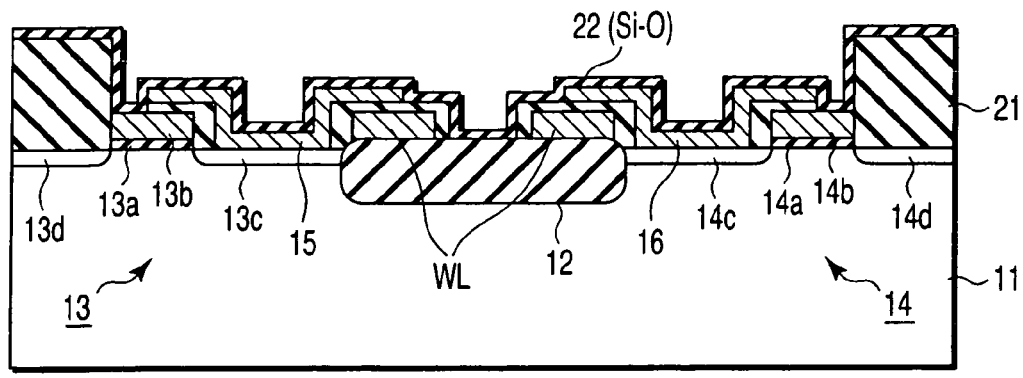
F I G. 5
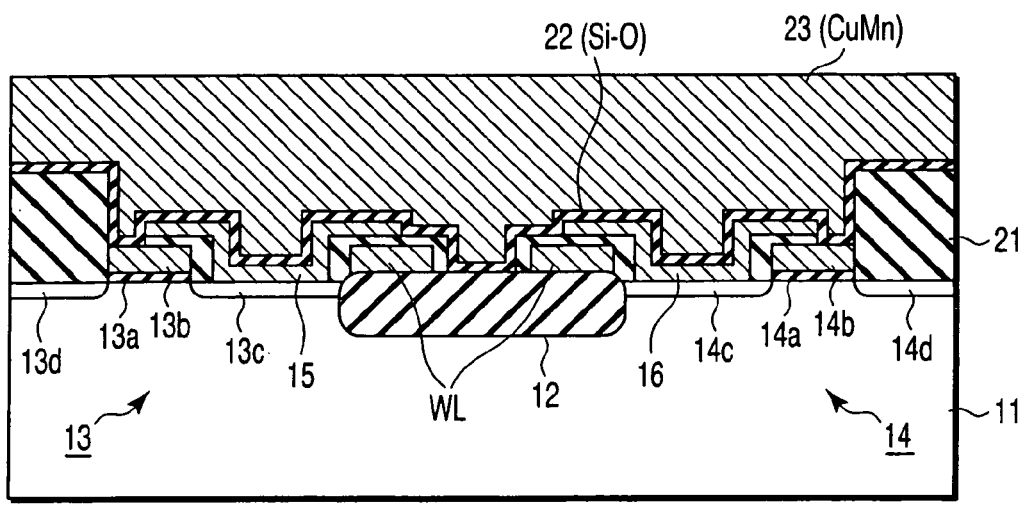
F I G. 6
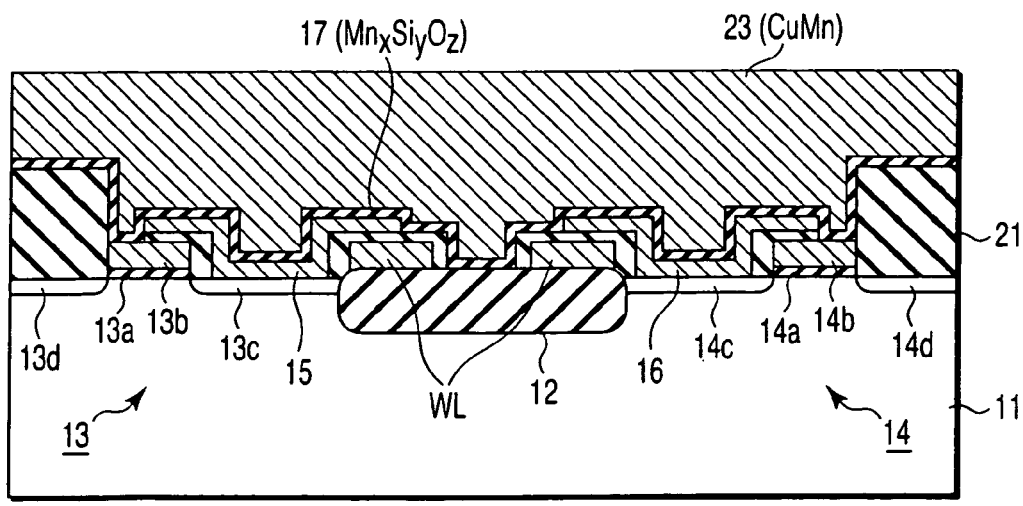
F I G. 7

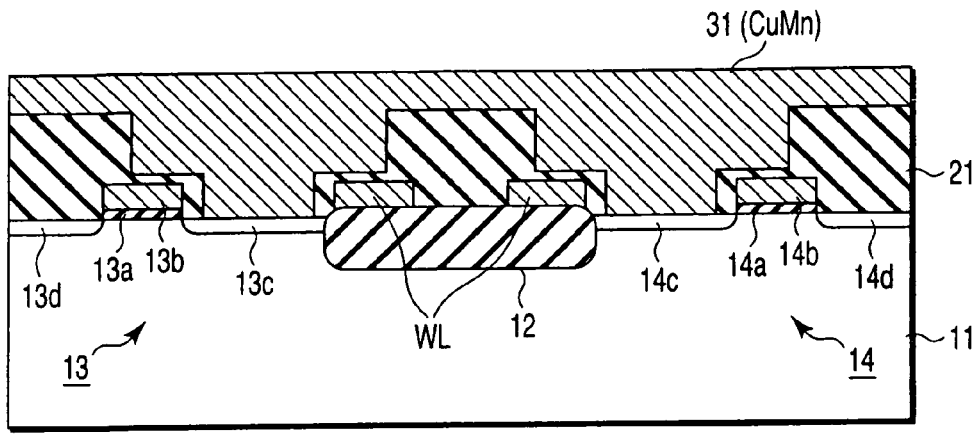
F I G. 11
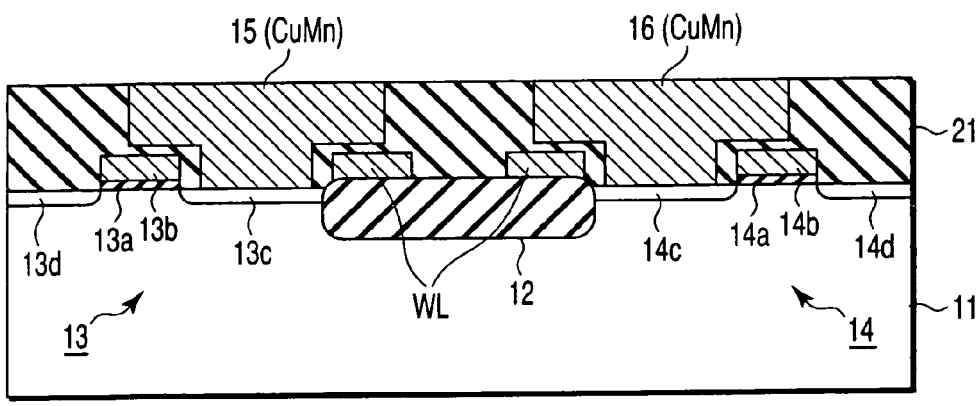
F I G. 12
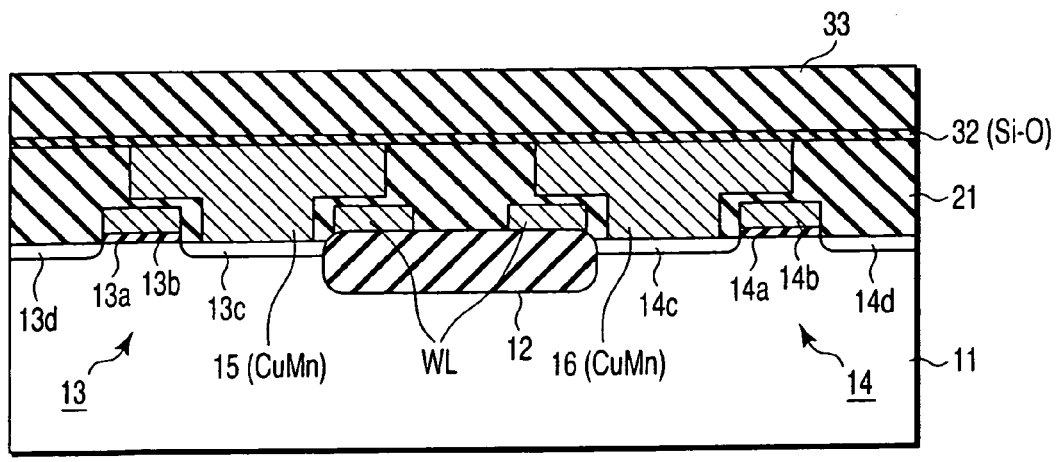
F I G. 13

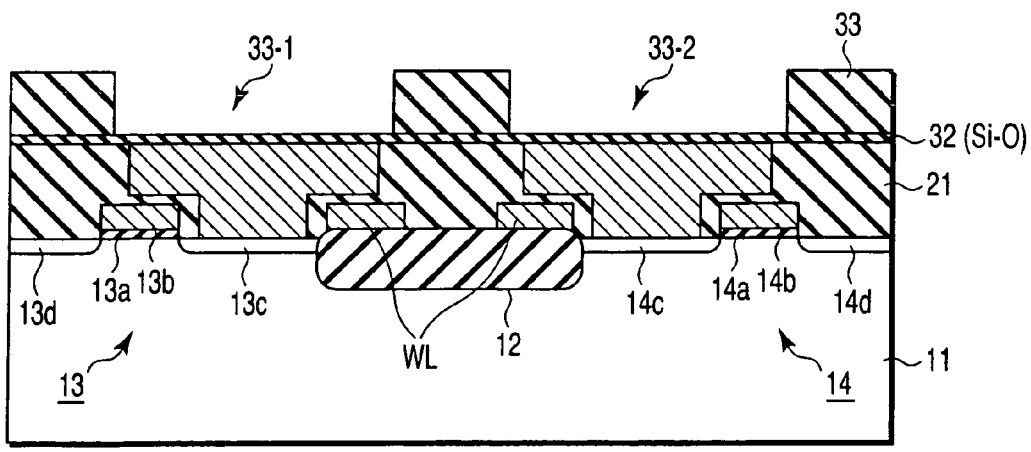
F I G. 14
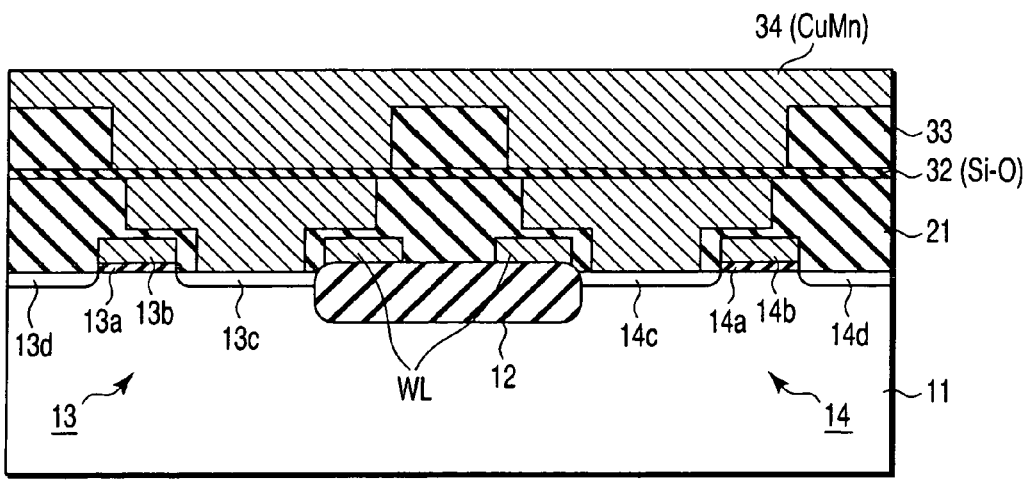
F I G. 15
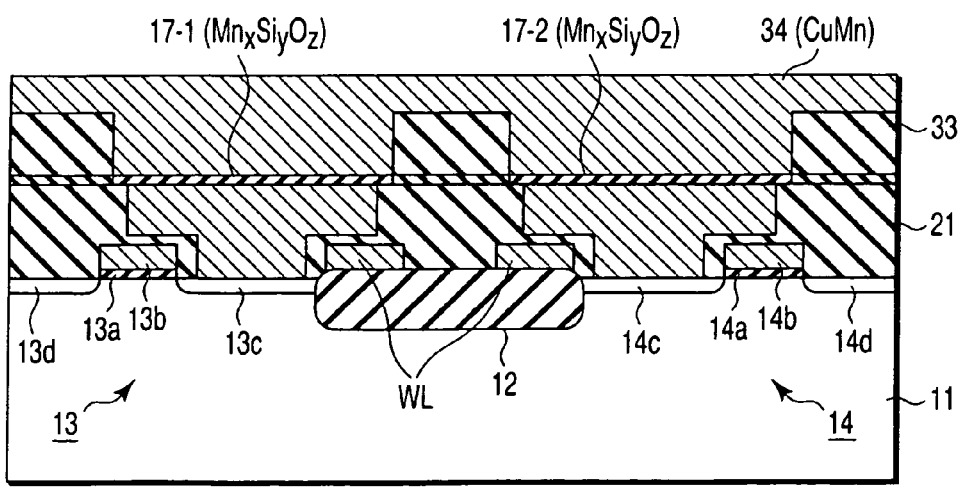
F I G. 16

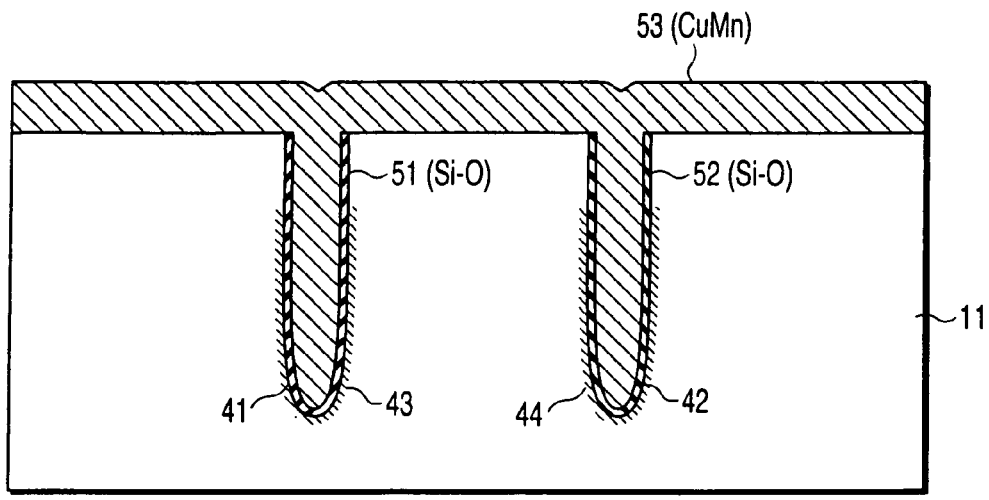
F I G. 20
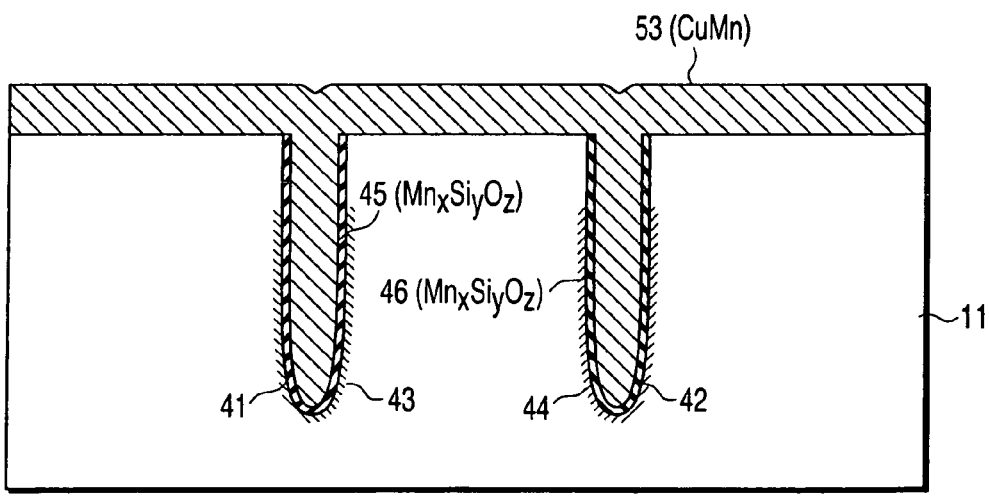
F I G. 21
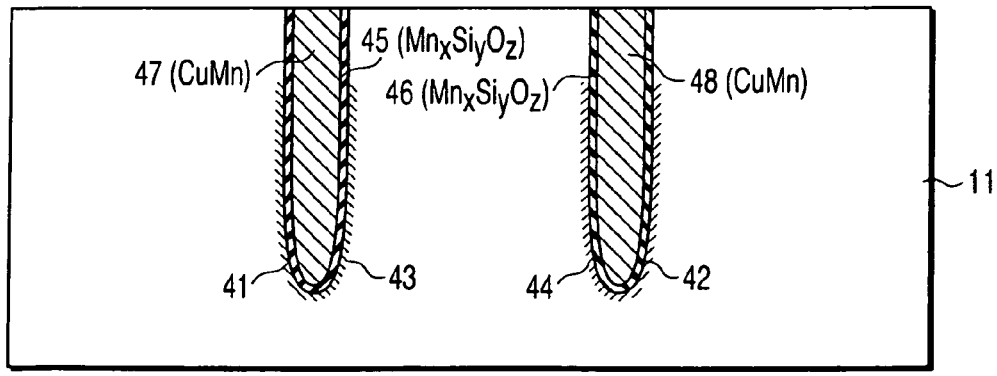
F I G. 22

CAPACITOR OF DYNAMIC RANDOM ACCESS MEMORY AND METHOD OF MANUFACTURING THE CAPACITOR

CROSS-REFERENCE TO RELATED APPLICATIONS

This application is based upon and claims the benefit of priority from prior Japanese Patent Application No. 2005-262502, filed Sep. 9, 2005, the entire contents of which are incorporated herein by reference.

BACKGROUND OF THE INVENTION

1. Field of the Invention

The present invention relates to a capacitor applied to a semiconductor device, for example, a dynamic random access memory (DRAM), and a method of manufacturing the capacitor.

2. Description of the Related Art

In general, a DRAM capacitor is roughly divided into a stack type and a trench type. Conventionally, in a stack type capacitor, a lower electrode serving as a storage electrode and an upper electrode serving as a plate electrode both are composed of a polysilicon layer; and a capacitor insulating film is formed of, for example, a silicon oxide film, an NO film or the like. In addition, in a trench type capacitor, a storage electrode is formed of a polysilicon layer, a plate electrode is formed of an impurity layer implanted in a substrate, and a capacitor insulating film is formed of, for example, a silicon oxide film, a NO film or the like.

With downsizing of the DRAM, there has been a growing demand a capacitor with high performance. In particular, an approach from two aspects, structure and material, has been made for increasing the capacitance of the capacitor. With respect to the structural aspect, for example, there has been a proposal that a stack type capacitor is structured to form a step on the upper electrode and the lower electrode in order to increase the area of a dielectric between the upper electrode and the lower electrode (refer to Jpn. Pat. Appln. KOKAI Publication Nos. 2003-332261 and 6-326267, for example). In addition, with respect to the material aspect, use of a material having a high dielectric constant, such as a $Ta_2O_5$ film or a BST film, is discussed (refer to Jpn. Pat. Appln. KOKAI Publication Nos. 2003-332261 and 9-97880, for example).

However, there is a limitation to improving an electrode structure by increasing an area of a dielectric. In order to increase the capacitance of a capacitor, there is a need for achieving a thin, uniform or highly dielectric capacitor insulating film. However, a conventional capacitor insulating film has been formed by a film forming process such as a thermal oxidation technique, a sputtering technique, or a chemical vapor deposition (CVD) technique. Thus, it has been difficult to achieve a thin, uniform, and highly dielectric capacitor insulating film. Therefore, there is a demand for a semiconductor device having a high performance capacitor insulating film which is thin, uniform, and highly dielectric, and for a method of manufacturing the semiconductor device.

BRIEF SUMMARY OF THE INVENTION

According to a first aspect of the invention, there is provided a semiconductor memory device comprising: a transistor formed on a semiconductor substrate, the transistor having a gate insulating film on the semiconductor substrate, a gate electrode on the gate insulating film, and first and second diffusion layers formed in the semiconductor substrate, the first and second diffusion layers being positioned at both sides of the gate electrode; a first electrode connected to the first diffusion layer of the transistor; a capacitor insulating film formed on the first electrode, the capacitor insulating film being formed of a silicon oxide film containing a substance which is faster than Cu in diffusion velocity and which more readily reacts with oxygen than Cu does; and a second electrode formed on the capacitor insulating film, the second electrode being formed of one of a Cu layer and another Cu layer containing the substance.

According to a second aspect of the invention, there is provided a semiconductor storage device comprising: a transistor formed on a semiconductor substrate, the transistor having a gate insulating film on the semiconductor substrate, a gate electrode on the gate electrode, and first and second diffusion layers formed in the semiconductor substrate, the first and second diffusion layers being positioned at both sides of the gate electrode; a trench formed in the semiconductor substrate; a capacitor insulating film formed on sidewall of the trench, the capacitor insulating film being formed of a silicon oxide film containing a substance which is faster than Cu in diffusion velocity and which more readily reacts with oxygen than Cu does; and a storage electrode formed in the trench, the storage electrode being formed of one of a Cu layer and another Cu layer containing the substance.

According to a third aspect of the invention, there is provided a method of manufacturing semiconductor device, comprising: forming a first electrode on a surface region of a substrate; forming an insulating film which contains silicon and oxygen on the first electrode; forming a Cu layer which is a second electrode on the insulating film, the Cu layer containing a substance which is faster than Cu in diffusion velocity and which more readily reacts with oxygen than Cu does; and chemically synthesizing the insulating film and the substance with each other by heat treatment, thereby forming a silicon oxide film which includes the substance.

BRIEF DESCRIPTION OF THE SEVERAL VIEWS OF THE DRAWING

FIG. 5 is a sectional view showing a manufacturing process that follows FIG. 4;

FIG. 6 is a sectional view showing a manufacturing process that follows FIG. 5;

FIG. 7 is a sectional view showing a manufacturing process that follows FIG. 6;

FIG. 11 is a sectional view showing a manufacturing process that follows FIG. 10;

FIG. 12 is a sectional view showing a manufacturing process that follows FIG. 11;

FIG. 13 is a sectional view showing a manufacturing process that follows FIG. 12;

FIG. 14 is a sectional view showing a manufacturing process that follows FIG. 13;

FIG. 15 is a sectional view showing a manufacturing process that follows FIG. 14;

FIG. 16 is a sectional view showing a manufacturing process that follows FIG. 15;

FIG. 20 is a sectional view showing a manufacturing process that follows FIG. 19;

FIG. 21 is a sectional view showing a manufacturing process that follows FIG. 20; and FIG. 22 is a sectional view showing a manufacturing process that follows FIG. 21.

DETAILED DESCRIPTION OF THE INVENTION

First Embodiment

Figure 1:
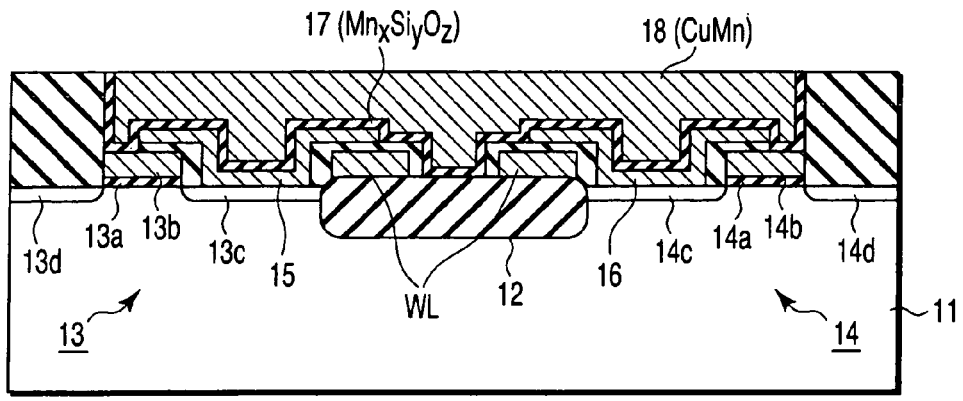
FIG. 1 is a sectional view showing a DRAM using a stack type capacitor according to a first embodiment.

FIG. 1 shows a first embodiment and shows an example of a DRAM having a stack type capacitor, for example. In this DRAM, a dielectric layer serving as a capacitor insulating film is formed of, for example, a $Mn_xSi_yO_z$ film. In a surface region of a silicon substrate 11, an element separating region 12 is formed of, for example, a silicon oxide film. Transistors 13 and 14 are formed in an element region separated by the element separating region 12. The transistors 13 and 14 are formed thereon with: gate insulating films 13a and 14a formed on the substrate 11; gate electrodes 13b and 14b on the gate insulating films 13a and 14a; and diffusion layers 13c, 13d, 14c, and 14d serving as source/drain regions formed in the substrate 11, the diffusion layers being positioned at both sides of the gate electrodes 13b and 14b. Lower electrodes 15 and 16 serving as storage electrodes are formed on the diffusion regions 13c and 14c. On these lower electrodes 15 and 16, a dielectric layer 17 serving as a capacitor insulating film is formed. An upper electrode 18 serving as a plate electrode is formed on the dielectric layer 17. Further, a bit line (not shown) is connected to the diffusion layers 13d and 14d. A passing word line WL is formed on the element separating region 12.

In the configuration, the lower electrodes 15 and 16 are formed of, for example, a polysilicon layer, and the dielectric layer 17 is formed of, for example, a $Mn_xSi_yO_z$ layer (manganese silicon oxide film). A composition of the $Mn_xSi_yO_z$ layer is represented as x:y:z=1:1:3 or 1:3:5, for example.

The upper electrode 18 is formed of a Cu layer or a CuMn alloy layer made of, for example, Cu (copper) and Mn (Manganese). In the CuMn alloy layer, with respect to Cu, Mn is contained by 0.05 to 10 percent by atom, for example. The $Mn_xSi_yO_z$ layer has a high dielectric constant, and a very thin film with thickness of 2 nm to 3 nm can be formed. Thus, a high performance capacitor can be achieved. That is, the capacitance C of the capacitor is represented by C=∈S/d (∈: dielectric constant, S: area, and d: distance between electrodes). The $Mn_xSi_yO_z$ film has very small film thickness and a high dielectric constant, so that the dielectric constant ∈ can be increased, and a distance "d" between electrodes can be reduced. Therefore, even if the area S is equal to the conventional area, the capacitance of the capacitor can be increased.

Figure 2A:
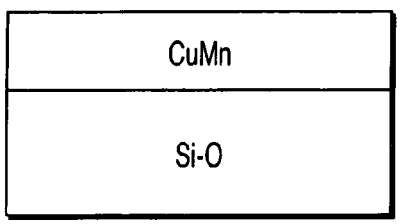
FIGS. 2A and 2B are views each showing a mechanism of forming a $Mn_xSi_yO_z$ film.
Figure 2B:
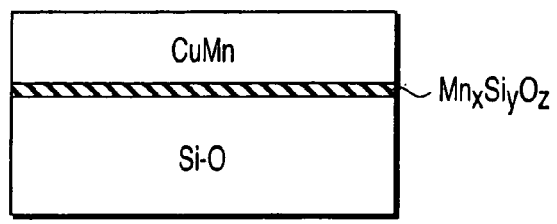

FIGS. 2A and 2B each schematically show a mechanism of forming a $Mn_xSi_yO_z$ layer. As shown in FIG. 2A, a CuMn alloy layer is formed on a Si—O layer which contains Si (silicon) and O (oxygen). In this state, when heat treatment is carried out at a temperature of about 200° C. to 350° C., for example, for 30 to 60 minutes, as shown in FIG. 2B, a $Mn_xSi_yO_z$ layer is formed on an interface between these layers. On the interface between the Si—O layer and the CuMn alloy layer, the $Mn_xSi_yO_z$ layer is formed by chemical reaction, and therefore, it is a film having a uniform constitution and uniform film thickness. Although the film thickness of the $Mn_xSi_yO_z$ layer is approximately 2 nm to 3 nm, it is possible to reduce the film thickness down to about 1 nm by controlling a heat treatment condition, such as a temperature and a time interval. In addition, redundant Mn which is not provided for reaction in the CuMn alloy layer appears on a surface of the CuMn alloy layer which does not come into contact with the Si—O layer, reacts with oxygen in air, and forms Mn—O or the like.

Now, a method of manufacturing the DRAM shown in FIG. 1 will be described with reference to FIGS. 3 to 8. In FIGS. 3 to 8, like constituent elements in FIG. 1 are designated by like reference numerals.

Figure 3:
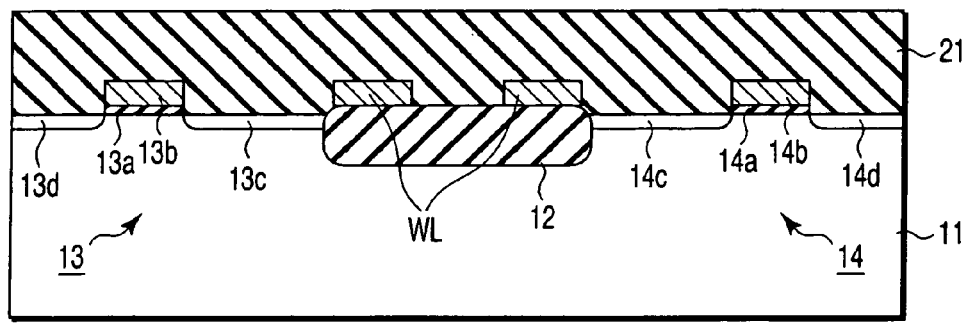
FIG. 3 is a sectional view showing a method of manufacturing the DRAM using the stack type capacitor according to the first embodiment.

As shown in FIG. 3, the element separating region 12, the transistors 13 and 14 and the passing word line WL are formed in a surface region of the substrate 11 by a well-known manufacturing method. Then, an insulating film 21 is fully formed by, for example, chemical vapor deposition (CVD). The insulating film 21 is, for example, a silicon oxide film.

Figure 4:
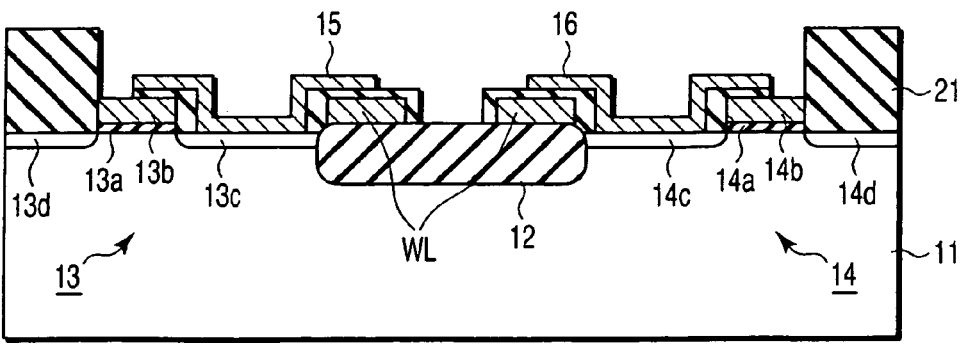
FIG. 4 is a sectional view showing a manufacturing process that follows FIG. 3.

Thereafter, as shown in FIG. 4, the insulating film 21 is etched, and the diffusion layers 13c and 14c of the transistors 13 and 14 are exposed. The lower electrodes 15 and 16 are formed in contact with the exposed diffusion layers 13c and 14c of the transistors 13 and 14. That is, after etching the insulating film 21, a polysilicon layer, for example, is fully deposited, and the polysilicon layer is etched in the shape of the lower electrode. The lower electrodes 15 and 16 are extended upwardly of the adjacent gate electrodes 13b and 14b or upwardly of the word line WL.

Next, as shown in FIG. 5, an Si—O layer 22 containing silicon and oxygen is fully formed by, for example, heat oxidization or CVD. It is desirable that the film thickness of the Si—O layer 22 be substantially equal to that of the $Mn_xSi_yO_z$ layer in order to make the $Mn_xSi_yO_z$ layer, which is to be finally formed, uniform and thin.

Then, as shown in FIG. 6, a CuMn alloy layer 23 is formed all over the Si—O layer 22. The CuMn alloy layer 23, first, is formed thinly with film Cu and Mn on the Si—O layer 22 by a sputtering technique or CVD, followed by further forming Cu by plating, CVD or the like.

Then, heat treatment is carried out under a predetermined condition, i.e., at a temperature of 200° C. to 350° C., for example, and a time interval of 30 minutes to 60 minutes, for example. By this heat treatment, a $Mn_xSi_yO_z$ layer is formed on an interface between the Si—O layer 22 and the CuMn alloy layer 23.

In this manner, the dielectric layer 17 serving as a capacitor insulating film composed of the $Mn_xSi_yO_z$ film is formed as shown in FIG. 7.

Next, for example, with the insulating film 21 being a stopper, the redundant CnMn alloy layer 23 is removed by, for example, CMP. In this way, as shown in FIG. 1, the upper electrode 18 composed of the CuMn alloy layer 23 is formed by a damascene technique. Then, for example, an interlayer insulating film and a bit line (not shown) are formed by a manufacturing method similar to a well-known DRAM manufacturing method.

The upper electrode 18 is composed of the CuMn alloy layer 23, as described above. However, for example, in forming the $Mn_xSi_yO_z$ film, the upper electrode 18 may be produced as a Cu layer in the case where Mn of the CuMn alloy layer 23 is fully used.

In addition, when a capacitor insulating film is formed, MnO is precipitated on the surface of the upper electrode by heating the electrode in an oxygen atmosphere. Redundant Mn can be removed from the upper electrode by removing the MnO by CMP or the like. Therefore, it is possible to from the upper electrode close to pure Cu.

In addition, in the case where the Si—O layer 22 formed on the lower electrodes 15 and 16 is not fully used to form the $Mn_xSi_yO_z$ film, the dielectric layer 17 may be produced in a dual-layered structure such that the lower layer are made of a Si—O layer and that the upper layer is made of the $Mn_xSi_yO_z$ layer.

In the case where the upper electrode 18 made of the CuMn alloy layer or Cu layer is buried in the insulating film 21, in general, a barrier film is formed of, for example, Ta (tantalum) between a side face of the upper electrode 18 and the insulating film 21 in order to prevent diffusion of Cu to the insulating film 21. However, in the case where the insulating film 21 is made of an Si—O film such as a silicon oxide film as described above, a $Mn_xSi_yO_z$ film is also formed on a side face of the upper electrode 18. The $Mn_xSi_yO_z$ film functions as a barrier film which prevents diffusion of Cu. Therefore, there is no need for separately forming another barrier film.

According to the first embodiment described above, the dielectric layer 17 serving as a capacitor insulating film is composed of a $Mn_xSi_yO_z$ film. The $Mn_xSi_yO_z$ film can achieve a high dielectric constant, and the capacitance of a capacitor can be increased. Moreover, the $Mn_xSi_yO_z$ film can be formed to have a film thickness of approximately 2 nm to 3 nm which is very small as compared with, for example, the film thickness of an NO film (for example, 5 nm). Thus, a distance between the electrodes can be reduced. Therefore, by using the $Mn_xSi_yO_z$ film, the capacitance of the capacitor can be increased in association with both the dielectric constant and the distance between the electrodes.

In addition, in the case where the upper electrode 18 has been formed of the CuMn alloy layer, a Si—O based material is used for the insulating film 21, whereby the $Mn_xSi_yO_z$ film having a Cu diffusion preventing function is formed on the interface between the upper electrode 18 and the insulating film 21. Thus, there is no need for separately forming a barrier film on the interface between the upper electrode 18 and the insulating film 21, and thus, there is provided an advantage that a manufacturing process can be simplified.

Second Embodiment

Figure 8:
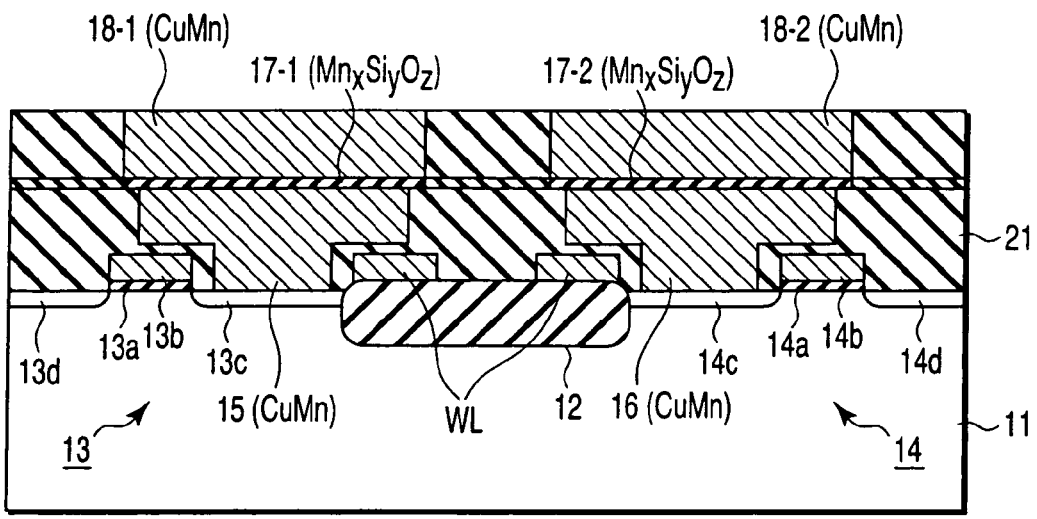
FIG. 8 is a sectional view showing a DRAM using a stack type capacitor according to a second embodiment.

FIG. 8 shows a second embodiment and shows an example of a DRAM using a stack type capacitor. In this DRAM as well, a dielectric layer serving as a capacitor insulating film is formed of, for example, a $Mn_xSi_yO_z$ film. In FIG. 8, like constituent elements in FIG. 1 are designated by like reference numerals, and only different constituent elements will be described here.

In the first embodiment, the lower electrodes 15 and 16 have been formed of a polysilicon layer. In contrast, in the second embodiment, the lower electrodes 15 and 16 are also formed of a CuMn alloy layer or a Cu layer, as shown in FIG. 8. Upper faces of the lower electrodes 15 and 16 are planarized along a surface of the insulating film 21. A dielectric film 17 composed of a $Mn_xSi_yO_z$ film is formed on the flattened lower electrodes 15 and 16. Further, upper electrodes 18-1 and 18-2 formed of a CuMn alloy layer or a Cu layer are formed on the dielectric films 17-1 and 17-2.

Now, a DRAM manufacturing method shown in FIG. 8 will be described with reference to FIGS. 9 to 16. In FIGS. 9 to 16, like constituent elements in FIG. 8 are designated by like reference numerals.

Figure 9:
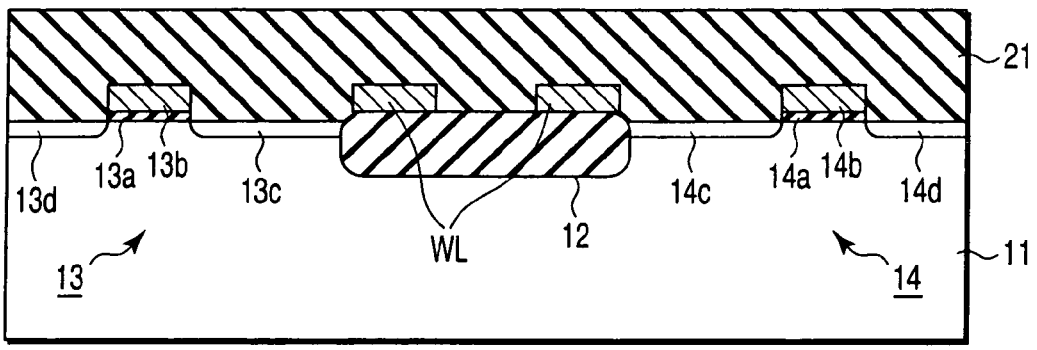
FIG. 9 is a sectional view showing a method of manufacturing the DRAM using the stack type capacitor according to the second embodiment.

As shown in FIG. 9, an element separating region 12, transistors 13 and 14, and a passing word line WL are formed in a surface region of a substrate 11 by a well-known manufacturing method. Then, an insulating film 21 is fully formed by, for example, CVD. The insulating film 21 is, for example, a silicon oxide film.

Figure 10:
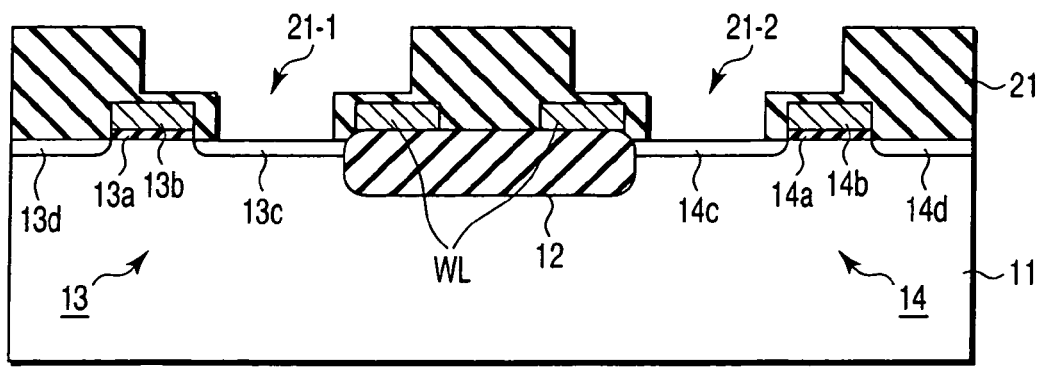
FIG. 10 is a sectional view showing a manufacturing process that follows FIG. 9.

Now, as shown in FIG. 10, the insulating film 21 is etched, and opening sections 21-1 and 21-2 which expose diffusion layers 13c and 14c of the transistors 13 and 14 are formed. These opening sections 21-1 and 21-2 are formed above the adjacent gate electrodes or word line WL.

Thereafter, as shown in FIG. 11, a CuMn alloy layer 31 is fully formed. A method of forming the CuMn alloy layer 31 is identical to that of the first embodiment. For example, Cu and Mn are thinly formed as a film by a sputtering technique, CVD or the like, and then, Cu is further formed by plating, CVD or the like.

Now, as shown in FIG. 12, with the insulating layer 21 as a stopper, the CuMn alloy layer 31 is planarized by CMP, and the lower electrodes 15 and 16 are formed.

Next, an Si—O layer 32 is fully formed as shown in FIG. 13. It is desirable that the film thickness of the Si—O layer 32 be substantially equal to that of the $Mn_xSi_yO_z$ film in order to uniformly and thinly form the $Mn_xSi_yO_z$ film which is to be finally formed. An insulating film 33 is formed on the Si—O layer 32. The insulating film 33 is, for example, a silicon oxide film.

Then, a region for forming the upper electrode of the insulating film 33 is etched as shown in FIG. 14, and opening sections 33-1 and 33-2 which expose the Si—O layer 32 are formed on the insulating film 33. At the time of etching of the insulating film 33, the insulating film 33 is a silicon oxide film, and thus, a selectivity between the insulating film 33 and the Si—O layer 32 is small. Therefore, an etching time is controlled in order to leave the Si—O layer with desired thickness. A material for the insulating films 21 and 33 is not limited to the silicon oxide film, and, for example, another material such as a silicon nitride film can be used.

Next, a CuMn alloy layer 34 is fully formed as shown in FIG. 15. A method of forming the CuMn alloy layer 34 is identical to that of forming the lower electrodes 15 and 16.

Then, a heat treatment is carried out under a predetermined condition, i.e., at a temperature of, for example, 200° C. to 350° C., and at a time interval of, for example, 30 minutes to 60 minutes. In this manner, the $Mn_xSi_yO_z$ films are formed on an interface between the lower electrodes 15 and 16 and the Si—O layer 32, the lower electrodes being composed of a CuMn alloy layer, and on an interface between the Si—O layer 32 and the CuMn alloy layer 34.

In this manner, as shown in FIG. 16, dielectric films 17-1 and 17-2 composed of a $Mn_xSi_yO_z$ film are formed between the lower electrodes 15 and 16 and the CuMn alloy layer, the lower electrodes being composed of the CuMn alloy layer.

Then, with the insulating film 33 as a stopper, the redundant CuMn alloy layer 34 is removed by CMP, and upper electrodes 18-1 and 18-2 are formed as shown in FIG. 8. Then, an interlayer insulating film or a bit line (not shown) is formed by a well-known manufacturing method.

The dielectric layers 17-1 and 17-2 may be produced as a laminated structure such as $Mn_xSi_yO_z/Si$—$O/Mn_xSi_yO_z$ or $Mn_xSi_yO_z/Si$—O, or alternatively, Si—O/$Mn_xSi_yO_z$ depending on an amount of Mn, an amount of Si—O or the like.

According to the second embodiment described above, both of the lower electrodes 15 and 16 and the upper electrodes 18-1 and 18-2 are composed of a CuMn alloy layer, and the dielectric layers 17-1 and 17-2 composed of a $Mn_xSi_yO_z$ film are formed between the lower electrode 15 and the upper electrode 18-1 and between the lower electrode 16 and the upper electrode 18-2. Thus, according to the second embodiment, as in the first embodiment, it is possible to form a stack type capacitor of high performance.

In addition, according to the second embodiment, a lower electrode is formed of a CuMn alloy layer, so that the lower electrode can be formed by a damascene technique in addition to the upper electrode. In the case where the lower electrode is formed of polysilicon, there is a need for etching an insulating film and polysilicon, thus increasing an etching count. Moreover, there is a need for processes for forming a mask, whose number is equal to the etching count, and thus, a processing variation is prone to occur. However, in the case where the CuMn alloy layer is used, only etching of an insulating film suffices, thus making it possible to reduce the etching count. Therefore, a processing variation can be reduced and a manufacturing process can be simplified.

According to the second embodiment described above, the upper electrodes 15 and 16 and the lower electrodes 18-1 and 18-2 are made of CuMn alloy layers. However, the present embodiment is not limited thereto, and, even in the case where either of the upper electrodes and the lower electrodes are made of the CuMn alloy layer and the others are made of Cu, it is possible to form a dielectric layer made of a $Mn_xSi_yO_z$ film.

In addition, in the second embodiment, heat treatment for forming a $Mn_xSi_yO_z$ film has been carried out after forming the upper electrodes without being limited thereto. For example, after the Si—O layer 32 has been formed on the lower electrodes 15 an 16, heat treatment may be carried out before forming the CuMn alloy layer 34 for the upper electrodes 18-1 and 18-2. In this case, the $Mn_xSi_yO_z$ film is formed on an interface between the lower electrodes 15 and 16. In the case of this example, there is no need for the upper electrodes 18-1 and 18-2 to be formed of the CuMn alloy layer, and it is possible to use a material such as Cu or polysilicon, for example.

Third Embodiment

Figure 17:
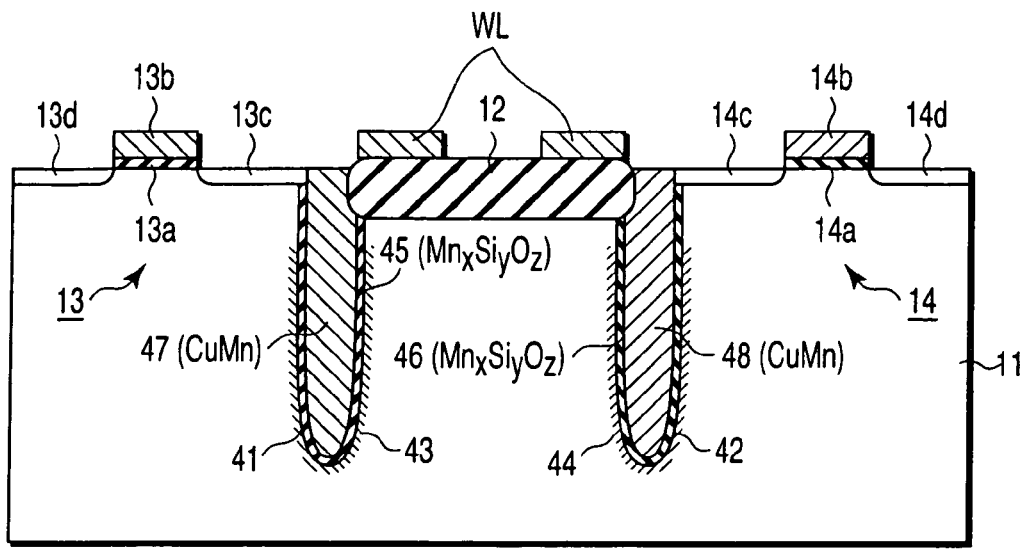
FIG. 17 is a sectional view showing a DRAM using a trench type capacitor according to a third embodiment.
Figure 18:
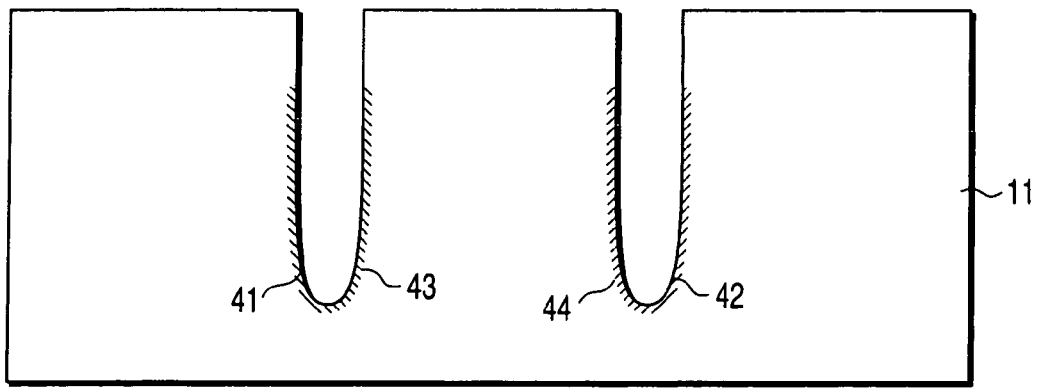
FIG. 18 is a sectional view showing a method of manufacturing the DRAM using the trench type capacitor according to the third embodiment.

FIG. 17 shows a third embodiment and shows an example of a DRAM having a trench type capacitor, for example. In this DRAM as well, a dielectric layer serving as a capacitor insulating film is formed of, for example, a $Mn_xSi_yO_z$ film. In FIG. 17, like constituent elements according to first and second embodiments are designated by like reference numerals, and only different constituent elements will be described here.

For example, in a p-type substrate 11, trenches 41 and 42 are formed in contact with an element separating region 12. In the substrate 11 that comes into contact with these trenches 41 and 42, n-type impurity layers 43 and 44 configuring a plate electrode are formed. Dielectric layers 45 and 46 serving as capacitor insulating films are formed on an inside face of the trenches 41 and 42. These dielectric layers 45 and 46 are composed of, for example, a $Mn_xSi_yO_z$ film. The inside of each of the trenches 41 and 42 is filled with a CuMn alloy layer which configures storage electrodes 47 and 48, for example. The storage electrodes 47 and 48 are connected to the diffusion layers 13c and 14c of the transistors 13 and 14, respectively.

Now, a method of manufacturing a DRAM shown in FIG. 17 will be described with reference to FIGS. 18 to 22. In FIGS. 18 to 22, like constituent elements in FIG. 17 are designated by like reference numeral.

First, the substrate 11 is etched, and the deep trenches 41 and 42 are formed in the substrate 11. Then, an n-type impurity ion is implanted, for example, obliquely at the inside of the trenches 41 and 42, and the n-type impurity layers 43 and 44 are formed in the substrate 11 around the trenches 41 and 42.

Figure 19:
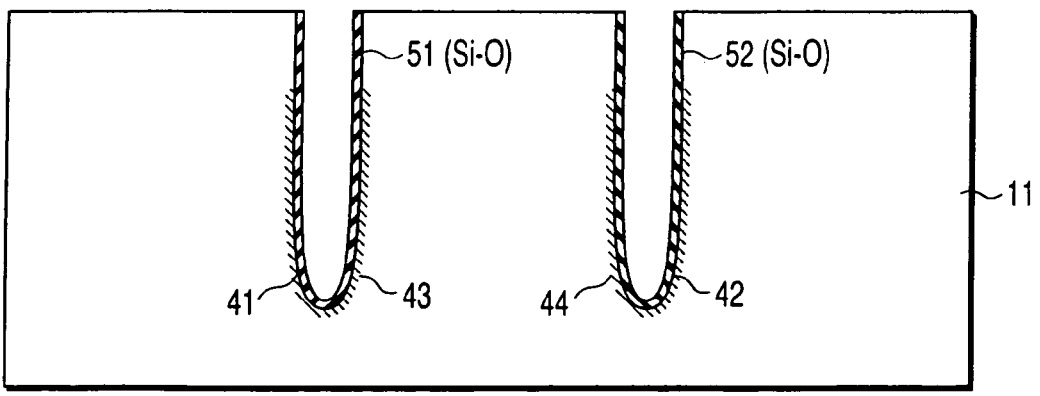
FIG. 19 is a sectional view showing a manufacturing process that follows FIG. 18.

Then, as shown in FIG. 19, the Si—O layers 51 and 52 containing silicon and oxygen are formed all over the inside surfaces of the trenches 41 and 42 by, for example, heat oxidization or CVD. It is desirable that the film thickness of the Si—O layers 51 and 52 be substantially equal to, for example, that of a $Mn_xSi_yO_z$ film which is to be finally formed.

Then, as shown in FIG. 20, a CuMn alloy film 53 is fully formed, and is filled in the trenches 41 and 42. The CuMn alloy layer 53, as described previously, is formed by thinly forming Cu and Mn as a film on the Si—O layers 51 and 52 by a sputtering technique, CVD or the like, and then, further forming Cu by plating, CVD or the like. Here, even in the case where the inside of the trenches 41 and 42 cannot be fully embedded in the CuMn alloy layer 53 and a void is produced at a center part of the trenches 41 an 42, the function of a storage electrode is not lost.

Then, a heat treatment is carried out under a predetermined condition, i.e., at a temperature of, for example, 200° C. to 350° C., and at a time interval of, for example, 30 minutes to 60 minutes. By the heat treatment, a $Mn_xSi_yO_z$ film is formed on an interface between the Si—O layers 51 and 52 and the CuMn alloy layer 53.

In this way, the dielectric layers 45 and 46 serving as capacitor insulating films composed of $Mn_xSi_yO_z$ films are formed as shown in FIG. 21.

Then, as shown in FIG. 22, the redundant CuMn alloy layer 53 left on the substrate 11 is removed by CMP, and the storage electrodes 47 and 48 composed of a CuMn alloy layer are formed in the trenches 41 and 42. Then, the element separating region 12 and the transistors 13 and 14 are formed by a method which is similar to conventional methods.

In the third embodiment as well, as in the first and second embodiments, the dielectric layers 45 and 46 may be produced as a laminated structure made of a Si—O layer and a $Mn_xSi_yO_z$ film depending on an amount of Mn contained in the CuMn alloy layer 53 and the film thickness of the Si—O layers 51 and 52.

According to the third embodiment described above, the $Mn_xSi_yO_z$ film is used as the dielectric layers 45 and 46 of the trench type capacitors. Thus, a high dielectric constant can be obtained. Moreover, the film thickness of the $Mn_xSi_yO_z$ film is 2 nm to 3 nm which is very small, and a distance between electrodes can be reduced. Therefore, even in the case where a diameter of trench has been reduced, it is possible to obtain high capacitance.

While the first to third embodiments have described that a dielectric layer serving as a capacitor insulating film is composed of a $Mn_xSi_yO_z$ film, the dielectric layer can be formed of an $\alpha_xSi_yO_z$ film without being limited thereto. Here, to a metal element α, it is possible to apply at least one element selected from a group consisting of Nb, Zr, Cr, V, Y, Tc, and Re, for example. These metal elements a may be metal elements which form an oxide faster than Cu in diffusion velocity in a layer containing Cu, which more readily reacts with oxygen than Cu does, and which are more thermally stable than Cu. In addition, in the case where other metal element α than Mn is used, the upper electrodes and the lower electrodes described previously or storage electrodes may be produced as a Cuα alloy layer. In this way, advantageous effects similar to those of the first to third embodiments can be attained by means of a dielectric layer which is composed of an $\alpha_x Si_y O_z$ film using other metal element α than Mn.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising: a transistor formed on a semiconductor substrate, the transistor having a gate insulating film on the semiconductor substrate, a gate electrode on the gate insulating film, and first and second diffusion layers formed in the semiconductor substrate, the first and second diffusion layers being positioned at both sides of the gate electrode; a trench formed in the semiconductor substrate; a capacitor insulating film formed on a sidewall of the trench, the capacitor insulating film being formed of a silicon oxide film containing a substance which is faster than Cu in diffusion velocity and which more readily reacts with oxygen than Cu does; and a storage electrode formed in the trench and connected to the first diffusion layer of the transistor, the storage electrode being formed of one of a Cu layer and another Cu layer containing the substance.

2. The device according to claim 1, wherein the substance is any one of Mn, Nb, Zr, Cr, V, Y, Tc, or Re.

3. The device according to claim 1, further comprising an impurity layer formed in the semiconductor substrate outside of the trench.

4. The device according to claim 1, wherein the device is a DRAM having a trench type capacitor.

* * * * *